(12) United States Patent
Padhi et al.

(10) Patent No.: US 7,259,111 B2
(45) Date of Patent: Aug. 21, 2007

(54) INTERFACE ENGINEERING TO IMPROVE ADHESION BETWEEN LOW K STACKS

(75) Inventors: Deenesh Padhi, Sunnyvale, CA (US); Ganesh Balasubramanian, Sunnyvale, CA (US); Annamalai Lakshmanan, Santa Clara, CA (US); Zhenjiang Cui, San Jose, CA (US); Juan Carlos Rocha-Alvarez, Sunnyvale, CA (US); Bok Hoen Kim, San Jose, CA (US); Hichem M'Saad, Santa Clara, CA (US); Steven Reiter, Poughkeepsie, NY (US); Francimar Schmitt, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/142,124

(22) Filed: Jun. 1, 2005

(65) Prior Publication Data
US 2006/0160376 A1 Jul. 20, 2006

Related U.S. Application Data

(60) Provisional application No. 60/644,899, filed on Jan. 19, 2005.

(51) Int. Cl.
*H01L 21/469* (2006.01)

(52) U.S. Cl. .................. 438/787; 438/783; 438/786; 438/778; 257/E21.277; 257/E21.278

(58) Field of Classification Search ................ 438/438, 438/287, 99, 142, 503, FOR. 135, 758, 778–780, 438/783, 784, 786, 788, 790, FOR. 385, 438/FOR. 395; 257/642, 635, E21.275–E21.279
See application file for complete search history.

(56) References Cited

U.S. PATENT DOCUMENTS

| 5,129,359 | A | * | 7/1992 | Takei et al. ......... 118/723 MW |
| 5,541,444 | A | * | 7/1996 | Ohmi et al. ................ 257/587 |
| 5,926,689 | A | * | 7/1999 | Cote et al. ..................... 438/10 |

(Continued)

OTHER PUBLICATIONS

PCT International Search Report and Written Opinion for PCT/US2006/001741, dated Jul. 20, 2006 (APPM/009516.PCT).

*Primary Examiner*—Fernando L. Toledo
*Assistant Examiner*—Quovaunda Jefferson
(74) *Attorney, Agent, or Firm*—Patterson & Sheridan

(57) ABSTRACT

A method of depositing a organosilicate dielectric layer exhibiting high adhesion strength to an underlying substrate disposed within a single processing chamber without plasma arcing. The method includes positioning a substrate within a processing chamber having a powered electrode, flowing an interface gas mixture into the processing chamber, the interface gas mixture comprising one or more organosilicon compounds and one or more oxidizing gases, depositing a silicon oxide layer on the substrate by varying process conditions, wherein DC bias of the powered electrode varies less than 60 volts.

17 Claims, 8 Drawing Sheets

U.S. PATENT DOCUMENTS

| | | | |
|---|---|---|---|
| 6,136,654 A * | 10/2000 | Kraft et al. | 438/287 |
| 6,235,650 B1 * | 5/2001 | Yao | 438/786 |
| 6,251,770 B1 | 6/2001 | Uglow et al. | |
| 6,340,435 B1 | 1/2002 | Bjorkman et al. | |
| 6,348,725 B2 * | 2/2002 | Cheung et al. | 257/642 |
| 6,500,773 B1 * | 12/2002 | Gaillard et al. | 438/790 |
| 6,518,646 B1 | 2/2003 | Hopper et al. | |
| 6,521,302 B1 | 2/2003 | Campana-Schmitt et al. | |
| 6,570,256 B2 | 5/2003 | Conti et al. | |
| 6,669,858 B2 | 12/2003 | Bjorkman et al. | |
| 6,740,539 B2 | 5/2004 | Conti et al. | |
| 6,911,403 B2 | 6/2005 | Li et al. | |
| 2003/0017642 A1 * | 1/2003 | Conti et al. | 438/99 |
| 2003/0042605 A1 | 3/2003 | Andideh et al. | |
| 2003/0124874 A1 | 7/2003 | Matsuki | |

\* cited by examiner

INTERFACE ENGINEERING TO IMPROVE ADHESION BETWEEN LOW K STACKS

CROSS-REFERENCE TO RELATED APPLICATIONS

This application claims benefit of U.S. Provisional patent application Ser. No. 60/644,899, filed Jan. 19, 2005, which is herein incorporated by reference. This application is also related to U.S. patent application Ser. No. 10/645,675, filed Aug. 20, 2003 which is herein incorporated by reference.

BACKGROUND OF THE INVENTION

1. Field of the Invention

Embodiments of the present invention generally relate to the fabrication of integrated circuits. More particularly, embodiments of the present invention relate to a method for depositing organosilicate layers on a substrate.

2. Description of the Related Art

In the manufacture of integrated circuits, plasma processes are increasingly being used to replace thermal processes. Plasma processing provides several advantages over thermal processing. For example, plasma enhanced chemical vapor deposition (PECVD) allows deposition processes to be performed at substantially lower temperatures than the temperatures required in analogous thermal processes. This is advantageous for processes with stringent thermal budget demands, such as in very large scale or ultra-large scale integrated circuit (VLSI or ULSI) device fabrication.

However, one problem that has been encountered with plasma processing in integrated circuit fabrication is device damage that occurs as a result of exposure of a device to non-uniform plasma conditions, such as electric field gradients caused by changing process conditions. While the susceptibility or degree of device damage typically depends at least partially on the stage of device fabrication and the type of device, many types and stages of devices can experience plasma-induced damage (PID). For example, a substrate that has a barrier layer or dielectric layer deposited thereon is more susceptible to PID due to the accumulation of surface charge, and a buildup of potential gradients during processing. Furthermore, as the size of devices become smaller and the dielectric layers become increasingly thinner, devices are becoming increasingly susceptible to PID.

In order to further reduce the size of devices on integrated circuits, it has become necessary to use conductive materials having low resistivity and to use insulators having low dielectric constants (low-k) to reduce the capacitive coupling between adjacent metal lines. Methods to form low-k dielectric layers include PECVD of organosilicate precursor gases to form organosilicate dielectric layers, such as carbon doped silicon oxide films. One challenge in this area has been to develop a carbon doped silicon oxide dielectric film that has a low k value, but also exhibits desirable adhesion properties to the underlying substrate or adjacent dielectric diffusion barrier layer materials which include silicon, silicon dioxide, silicon carbide, silicon nitride, oxygen-doped silicon carbide, titanium, titanium nitride, tantalum, tantalum nitride, tungsten, aluminum, copper, and combinations thereof. Inadequate adhesion may result in delamination of the low-k dielectric layer from the underlying substrate and potential failure of the device. One approach to enhancing adhesion of carbon doped silicon oxide films is inserting a thin silicon oxide film between the carbon doped silicon oxide layer and the underlying barrier layer. However, the thin silicon oxide layer must be a minor portion of the combined dielectric film to retain significant reduction in dielectric constant. Furthermore, the deposition of a thin silicon oxide layer prior to deposition of a carbon doped silicon oxide layer substantially increases processing time unless the layers are deposited sequentially in the same chamber. Sequential deposition has resulted in plasma arcing when the deposition conditions are changed. The plasma arcing damages the substrate surface and effectively negates any advantage in depositing the thin silicon oxide film and the carbon doped silicon oxide layer in the same chamber.

Therefore, there is a need for a process for depositing an organosilicate dielectric layer exhibiting high adhesion strength to an underlying substrate without plasma arcing.

SUMMARY OF THE INVENTION

The present invention generally provides a method for depositing an organosilicate dielectric layer comprising sequentially depositing a silicon oxide layer having low carbon content and a carbon doped silicon oxide layer having a low dielectric constant within the same processing chamber without plasma arcing. In one embodiment, the method for depositing an organosilicate dielectric layer includes flowing an interface gas mixture comprising one or more organosilicon compounds and one or more oxidizing gases through a gas distribution plate, such as a showerhead, to a substrate surface at first deposition conditions, wherein a high frequency RF (HFRF) bias is applied to a powered electrode, such as the showerhead, to deposit a silicon oxide interface layer having less than about 3 atomic percent carbon, then increasing the flow rate of the one or more organosilicon compounds while depositing a transition layer on the interface layer, and then flowing a final gas mixture to deposit a carbon doped silicon oxide layer having at least 10 atomic percent carbon. Changing process conditions as described herein substantially reduces variation of DC bias of the powered electrode to a variation less than 60 volts during processing.

In another embodiment, the method for depositing an organosilicate dielectric layer includes concurrently increasing a low frequency RF (LFRF) power while increasing the flow rate of the one or more organosilicon compounds (e.g., OMCTS, TMCTS) to deposit the transition layer therebetween. In one aspect, the LFRF power is increased at a ramp-up rate between about 15 W/sec. and 45 W/sec. In another aspect, the organosilicon compound is octamethylcyclotetrasiloxane (OMCTS) and the increasing flow of the OMCTS is at a ramp-up rate in a range of about 300 mg/min./sec. to about 5000 mg/min./sec.

In a further embodiment, the method for depositing an organosilicate dielectric layer includes sequentially flowing an interface gas mixture comprising a flow rate of octamethylcyclotetrasiloxane (OMCTS) and a flow rate of oxygen gas at a OMCTS:O2 molar flow rate ratio of less than about 0.1 through a gas distribution plate to a substrate surface at first deposition conditions comprising a HFRF bias applied to the gas distribution plate to deposit a silicon oxide interface layer having less than about 1 atomic % carbon, and then increasing the flow rate of the OMCTS at a ramp-up rate in a range of about 300 mg/min./sec. to about 5000 mg/min./sec. while concurrently increasing a LFRF power applied to the gas distribution plate at a ramp-up rate between about 15 W/sec. and 45 W/sec. to deposit a transition layer on the interface layer, wherein DC bias of the gas distribution plate varies less than 60 volts, and subsequently flowing a final gas mixture to deposit a carbon doped silicon oxide layer having at least 10 atomic % carbon.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide a method of depositing an organosilicate dielectric layer exhibiting high adhesion strength to an underlying substrate, carbon containing silicon oxide layer, or silicon carbon layer without plasma arcing. Generally, one or more process conditions are varied during the deposition of the organosilicate dielectric layer such that plasma-induced damage (PID) to the substrate is minimized.

In one embodiment, a method of depositing an organosilicate dielectric layer exhibiting high adhesion strength includes varying the composition of the process gas in the process chamber as the organosilicate dielectric layer is deposited onto a substrate disposed therein such that PID to the substrate is minimized. Varying the composition of the process gas during deposition provides an organosilicate dielectric layer having an initial layer, i.e., interface layer or initiation layer, compositionally modified to provide good adherence to the underlying substrate.

Figure 1:
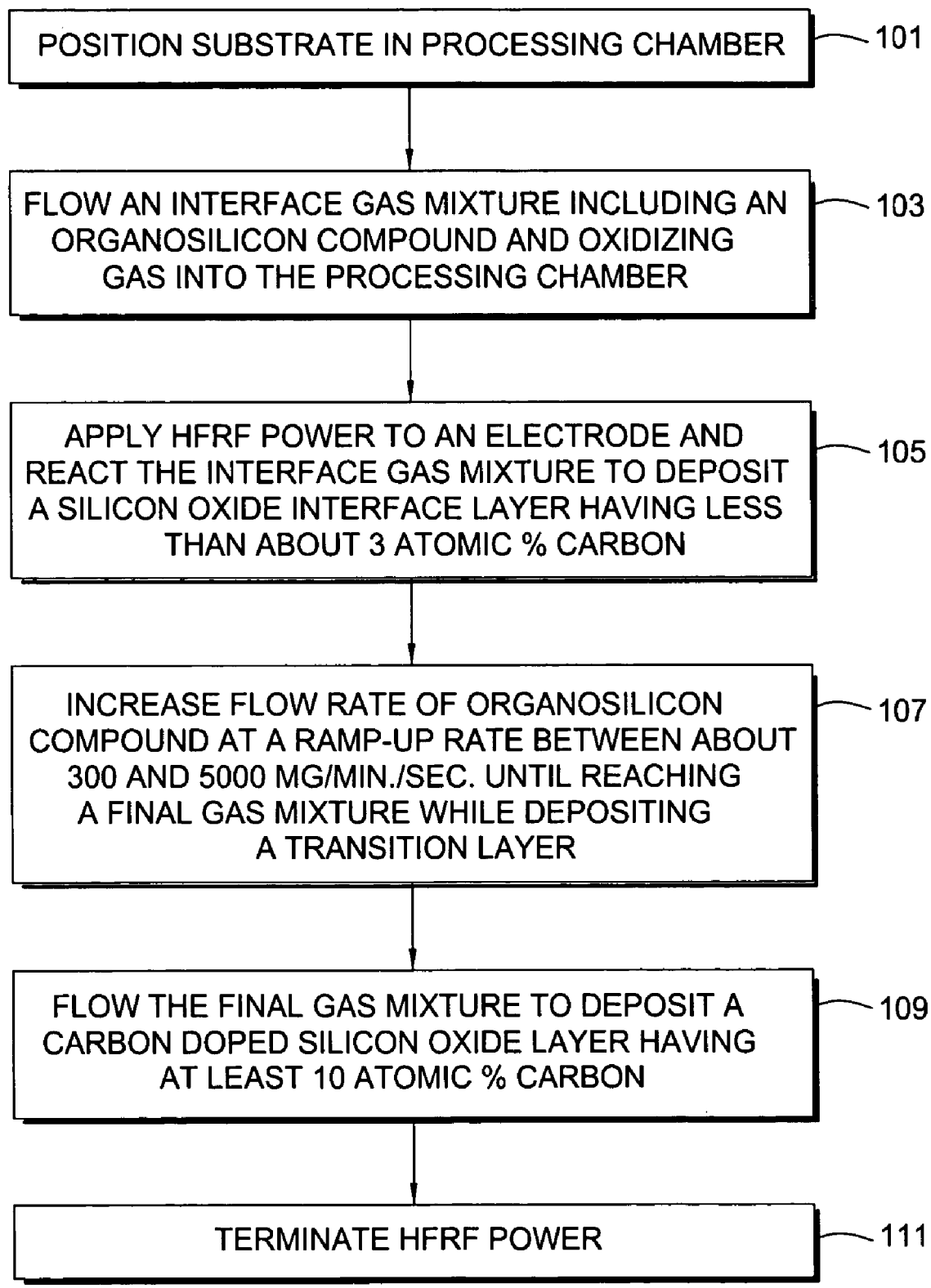
FIG. 1 is a process flow diagram illustrating a first method according to an embodiment of the invention.

FIG. 1 is a process flow diagram illustrating a method of depositing an organosilicate dielectric layer, according to a first embodiment of the invention. In step 101, a substrate is positioned on a substrate support in a processing chamber capable of performing PECVD. In step 103, an interface gas mixture having a composition including one or more organosilicon compounds and one or more oxidizing gases is introduced into the chamber through a gas distribution plate, such as a showerhead. In step 105, a high frequency radio-frequency (HFRF) power is applied to an electrode, such as the showerhead, in order to provide plasma processing conditions in the chamber. The interface gas mixture is reacted in the chamber in the presence of HFRF power to deposit an interface layer comprising a silicon oxide layer having less than 3 atomic percent carbon (excluding hydrogen), and preferably less than 1 atomic percent carbon, that adheres strongly to the underlying substrate. In step 107, the flow rate of the one or more organosilicon compounds is increased at a ramp-up rate between about 300 mg/min./sec. and about 5000 mg/min./sec., in the presence of the HFRF power, to deposit a transition layer until reaching a predetermined final gas mixture. The ramp-up of the flow rate conditions is performed such that variation in DC bias of the gas distribution plate is less than 60 volts, preferably less than 30 volts, to avoid PID. Upon reaching the predetermined final gas mixture, the final gas mixture having a composition including the one or more organosilicon compounds is reacted in the chamber, in the presence of HFRF power, to deposit a final layer comprising a carbon doped silicon oxide layer having at least 10 atomic percent carbon. The HFRF power is terminated in step 111. The chamber pressure is maintained during the HFRF power termination, such as by not opening the chamber throttle valve.

Figure 2:
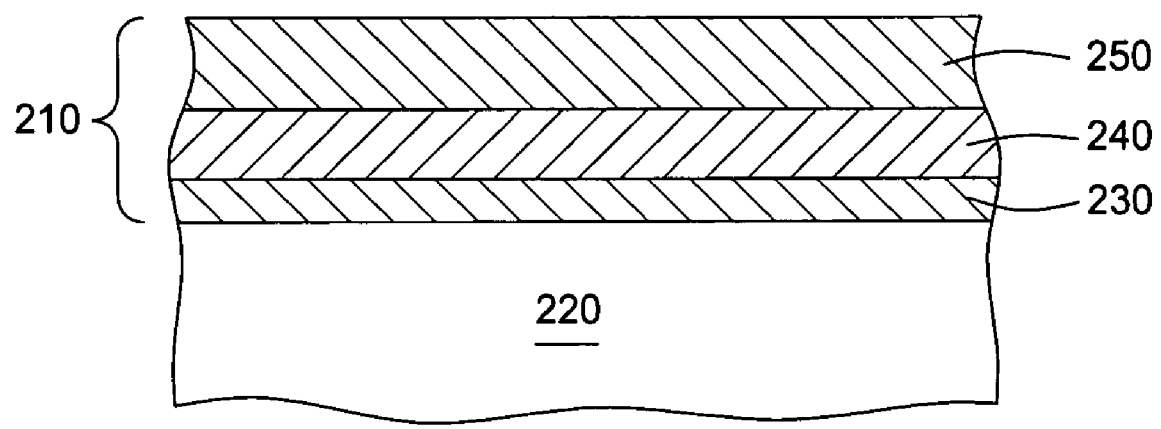
FIG. 2 is a cross-sectional view of an organosilicate dielectric layer formed according to embodiments of the invention.

FIG. 2 schematically illustrates a cross-sectional view of an organosilicate dielectric layer formed according to embodiments of the present invention. An organosilicate dielectric layer 210 is deposited on an underlying layer (e.g., barrier layer) 220 of the surface of a substrate disposed in a processing chamber capable of performing PECVD. A plasma of the interface gas mixture comprising a flow rate of one or more organosilicon compounds is formed, as described above with respect to steps 103 and 105 of FIG. 1, to deposit a silicon oxide interface layer 230 having less than 3 atomic % carbon, preferably less than 1 atomic % carbon, and strong adhesion to the underlying layer 220. The interface layer 230 is deposited to a thickness in a range of about 5 Å to about 100 Å, preferably about 20 Å to about 60 Å. After depositing the interface layer 230, the flow rate of the one or more organosilicon compounds is gradually increased to a predetermined final gas mixture, such that variation in DC bias of the gas distribution plate is less than 60 volts to avoid PID. While gradually increasing the flow rate of the one or more organosilicon compounds, a transition layer 240 is deposited onto the interface layer 230, as described above with respect to step 107 of FIG. 1. As deposition proceeds, the carbon concentration increases while the composition of the gas mixture is varied during deposition of the transition layer until reaching the final gas mixture. The transition layer 240 is deposited to a thickness in a range of about 10 Å to about 300 Å, preferably about 100 Å to about 200 Å. Upon reaching the final gas mixture composition, a plasma of the final gas mixture comprising a flow rate of one or more organosilicon compounds at the final set-point flow rate value is formed, as described above with respect to step 109 of FIG. 1, to deposit a carbon doped silicon oxide layer 250 having at least about 10 atomic percent carbon to a desired thickness. Preferably, the carbon doped silicon oxide layer 250 comprises a carbon concentration in a range of about 10 atomic percent carbon to 40 atomic percent carbon, and more preferably in a range of about 20 atomic percent carbon to 30 atomic percent carbon. The carbon doped silicon oxide layer 250 is deposited to a thickness in a range of about 200 Å to about 10,000 Å until the HFRF power is terminated in step 111. The carbon content of the deposited layers refers to an elemental analysis of the film structure. The carbon content is represented by the percent of carbon atoms in the deposited film, excluding hydrogen atoms, which are difficult to quantify. For example, a film having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

Figure 3:
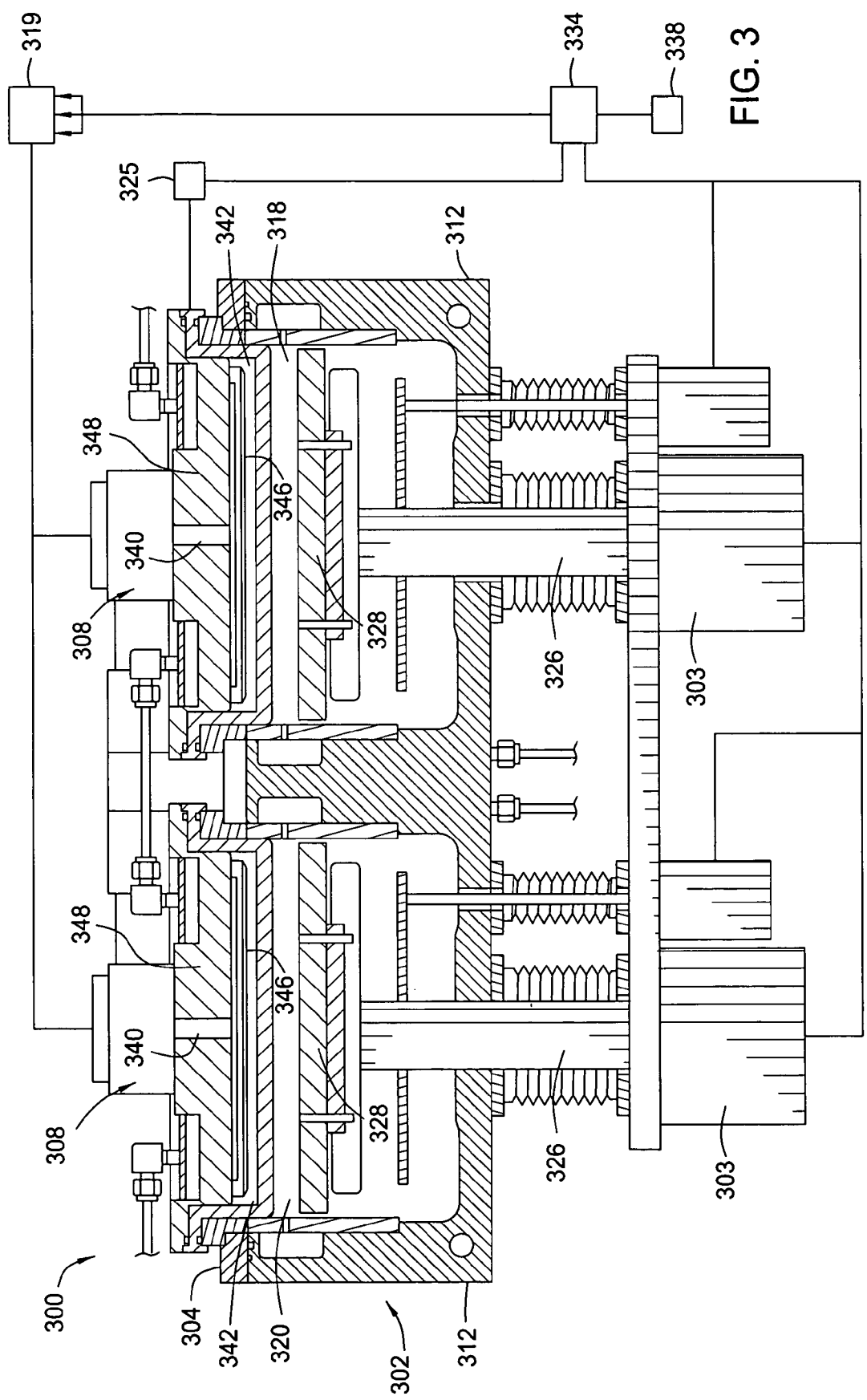
FIG. 3 is a cross-sectional diagram of an exemplary processing chamber that may be used for practicing embodiments of the invention.

FIG. 3 presents a cross-sectional, schematic diagram of a chemical vapor deposition (CVD) chamber 300 for depositing a carbon-doped silicon oxide layer. This figure is based upon features of the Producers® chambers currently manufactured by Applied Materials, Inc. The Producers® CVD chamber (200 mm or 300 mm) has two isolated processing regions that may be used to deposit carbon-doped silicon oxides and other materials. A chamber having two isolated processing regions is described in U.S. Pat. No. 5,855,681, which is incorporated by reference herein.

The chamber 300 has a body 302 that defines separate processing regions 318, 320. Each processing region 318, 320 has a pedestal 328 for supporting a substrate (not seen) within the chamber 300. The pedestal 328 typically includes a heating element (not shown). Preferably, the pedestal 328 is movably disposed in each processing region 318, 320 by a stem 326 which extends through the bottom of the chamber body 302 where it is connected to a drive system 303. Internally movable lift pins (not shown) are preferably provided in the pedestal 328 to engage a lower surface of the substrate. The lift pins are engaged by a lift mechanism (not shown) to receive a substrate before processing, or to lift the substrate after deposition for transfer to the next station.

Each of the processing regions 318, 320 also preferably includes a gas distribution assembly 308 disposed through a chamber lid 304 to deliver gases into the processing regions 318, 320. The gas distribution assembly 308 of each processing region normally includes a gas inlet passage 340 through manifold 348 which delivers gas from a gas distribution manifold 319 through a blocker plate 346 and then through a showerhead 342. The showerhead 342 includes a plurality of nozzles (not shown) through which gaseous mixtures are injected during processing. An RF (radio frequency) source 325 provides a bias potential to the showerhead 342 to facilitate generation of a plasma between the showerhead and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the deposition chamber 300. Typically an RF voltage is applied to the cathode while the chamber body 302 is electrically grounded. Power applied to the pedestal 328 creates a substrate bias in the form of a negative voltage on the upper surface of the substrate. This negative voltage is used to attract ions from the plasma formed in the chamber 300 to the upper surface of the substrate. The capacitive electric field forms a bias which accelerates inductively formed plasma species toward the substrate to provide a more vertically oriented anisotropic filming of the substrate during deposition, and etching of the substrate during cleaning.

During processing, process gases are uniformly distributed radially across the substrate surface. The plasma is formed from one or more process gases or a gas mixture by applying RF energy from the RF power supply 325 to the showerhead 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the showerhead 346 to enhance the decomposition of any gases introduced into the processing regions 318, 320.

A system controller 334 controls the functions of various components such as the RF power supply 325, the drive system 303, the lift mechanism, the gas distribution manifold 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the invention.

Figure 4:
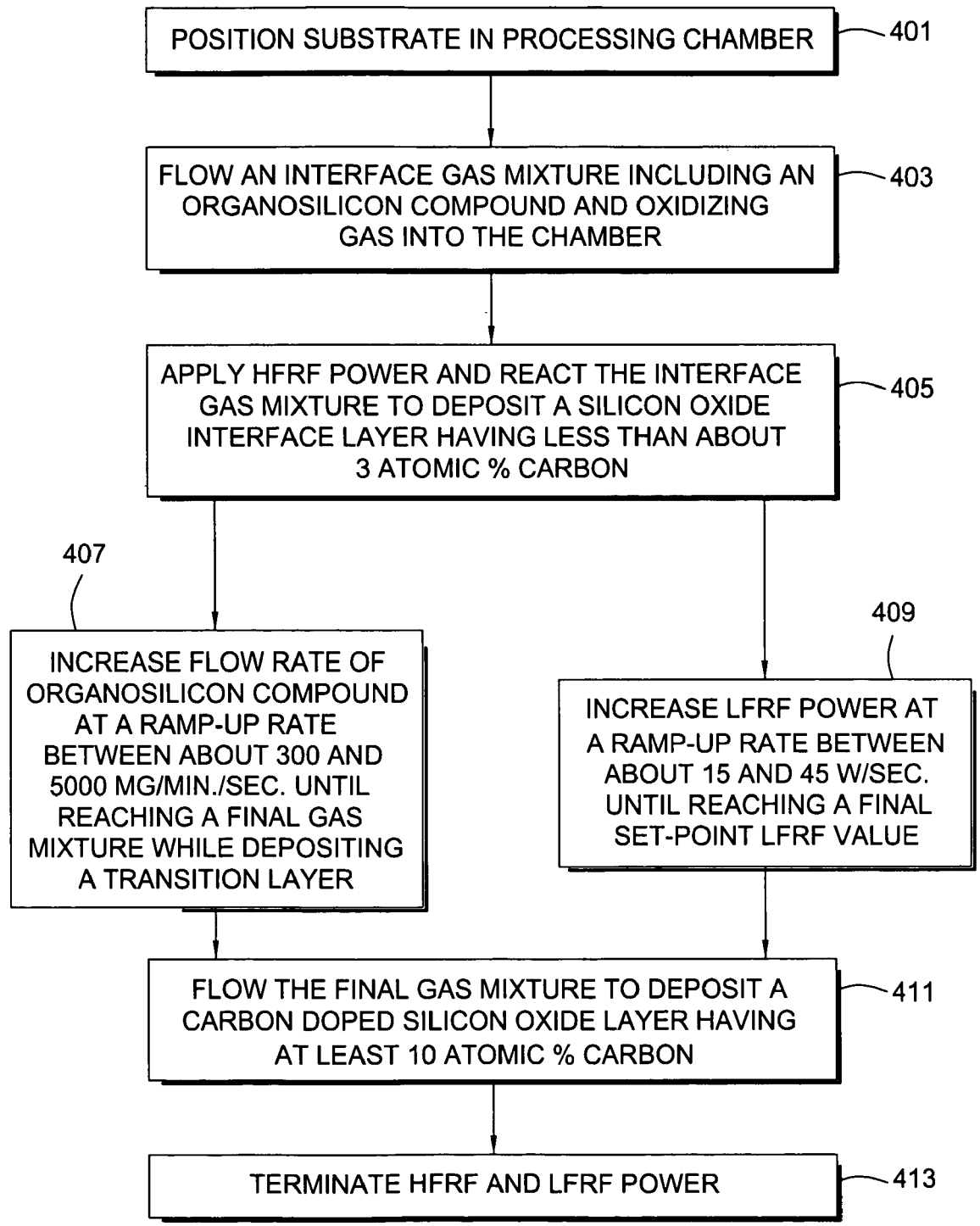
FIG. 4 is a process flow diagram illustrating a second method according to another embodiment of the invention.

FIG. 4 is a process flow diagram illustrating a second embodiment of the invention that may be performed using a processing chamber such as the processing chamber shown in FIG. 3. In the embodiment shown in FIG. 4, an additional step of providing LFRF power during deposition is introduced in order to modulate the stress of the organosilicate dielectric layer. The process begins in step 401, where a substrate is positioned on a substrate support in a processing chamber capable of performing PECVD. In step 403, an interface gas mixture having a composition including a flow rate of one or more organosilicon compounds and a flow rate of one or more oxidizing gases is introduced into the chamber through a showerhead. In step 405, HFRF power is applied to the showerhead in order to provide plasma processing conditions in the chamber. The interface gas mixture is reacted in the chamber in the presence of HFRF power applied to the showerhead to deposit an interface layer comprising a silicon oxide layer having less than 3 atomic percent carbon, and preferably less than 1 atomic percent carbon, that adheres strongly to the underlying substrate. In step 407, the flow rate of the one or more organosilicon compounds is increased at a ramp-rate between about 300 mg/min./sec. and about 5000 mg/min./sec. until reaching a predetermined final gas mixture. The flow rate of the one or more organosilicon compounds is increased in the presence of the HFRF, while concurrently increasing LFRF power, in step 409, from an initial set-point value of about 0 W to a final set-point value employed during the deposition of the final layer in step 411.

The changing process deposition conditions (e.g., gas mixture composition, RF frequency and power) are varied so as to ensure a variation in DC bias of the showerhead of less than 60 volts so as to avoid PID. The ramp-up rate of the LFRF power is preferably in a range of about 15 W/sec. to about 45 W/sec. Upon reaching the predetermined final gas mixture in step 411, the final gas mixture is reacted in the chamber, in the presence of HFRF and LFRF power, to deposit a final layer comprising a carbon doped silicon oxide layer having at least 10 atomic percent carbon. During this step, the LFRF power may be at a final set-point value in a range of about 80 W to about 200 W, preferably less than about 160 W, and more preferably about 125 W. The HFRF and LFRF power is terminated in step 413 after depositing the organosilicate dielectric layer to a desired thickness. The chamber pressure is maintained during the HFRF and LFRF power termination.

Optionally, steps 105 through 111 and steps 403 through 411 include varying the distance between the substrate and gas manifold, such as a showerhead or a gas distribution plate, in the processing chamber during the deposition process. Varying the volume between the gas manifold and the substrate in the presence of RF power is more fully described in U.S. patent application Ser. No. 10/645,675, filed Aug. 20, 2003 which is herein incorporated by reference.

Precursors and Processing Conditions for Deposition of Organosilicate Layers

In any of the embodiments described herein, an organosilicate dielectric layer is deposited from a process gas mixture comprising an organosilicon compound. The organosilicate layer may be used as a dielectric layer. The dielectric layer may be used at different levels within a device. For example, the dielectric layer may be used as a premetal dielectric layer, an intermetal dielectric layer, or a gate dielectric layer. The organosilicate layer is preferably a low-k dielectric layer, i.e., having a dielectric constant of less than about 3.0.

A wide variety of process gas mixtures may be used to deposit the organosilicate dielectric layer, and non-limiting examples of such gas mixtures are provided below. Generally, the gas mixture includes one or more organosilicon compounds (e.g., a first and a second organosilicon compound), a carrier gas, and an oxidizing gas. These components are not to be interpreted as limiting, as many other gas mixtures including additional components such as hydrocarbons (e.g., aliphatic hydrocarbons) are contemplated.

The term "organosilicon compound" as used herein is intended to refer to silicon-containing compounds including carbon atoms in organic groups. The organosilicon compound may include one or more cyclic organosilicon compounds, one or more aliphatic organosilicon compounds, or a combination thereof. Some exemplary organosilicon compounds include tetramethylcyclotetrasiloxane (TMCTS), octamethylcyclotetrasiloxane (OMCTS), pentamethylcyclopentasiloxane, hexamethylcyclotrisiloxane, diethoxymethylsilane (DEMS), dimethyldisiloxane, tetrasilano-2,6-dioxy-4,8-dimethylene, tetramethyldisiloxane, hexamethyldisiloxane (HMDS), 1,3-bis(silanomethylene) disiloxane, bis(1-methyldisiloxanyl)methane, bis(1-methyldisiloxanyl)propane, hexamethoxydisiloxane (HMDOS), dimethyldimethoxysilane (DMDMOS), and dimethoxymethylvinylsilane (DMMVS), or derivatives thereof. The one or more organosilicon compounds may be introduced into the processing chamber at a flow rate in a range of about 100 sccm to about 3,500 sccm, preferably between about 500 sccm and about 3,000 sccm.

The gas mixture optionally includes one or more carrier gases. Typically, one or more carrier gases are introduced with the one or more organosilicon compounds into the processing chamber. Examples of carrier gases that may be used include helium, argon, carbon dioxide, and combinations thereof. The one or more carrier gases may be introduced into the processing chamber at a flow rate less than about 20,000 sccm, depending in part upon the size of the interior of the chamber. Preferably the flow of carrier gas is in a range of about 500 sccm to about 1,500 sccm, and more preferably about 1,000 sccm. In some processes, an inert gas such as helium or argon is put into the processing chamber to stabilize the pressure in the chamber before reactive process gases are introduced.

The gas mixture also includes one or more oxidizing gases. Suitable oxidizing gases include oxygen ($O_2$), ozone ($O_3$), nitrous oxide ($N_2O$), carbon monoxide (CO), carbon dioxide ($CO_2$), and combinations thereof. The flow of oxidizing gas may be in a range of about 100 sccm to about 3,000 sccm, depending in part upon the size of the interior of the chamber. Typically, the flow of oxidizing gas is in a range of about 100 sccm to about 1,000 sccm. Disassociation of oxygen or the oxygen containing compounds may occur in a microwave chamber prior to entering the deposition chamber and/or by RF power as applied to process gas within the chamber.

During deposition, a controlled plasma is typically formed in the chamber adjacent to the substrate by RF energy applied to the showerhead using an RF power supply 325 as depicted in FIG. 3. Alternatively, RF power can be provided to the substrate support. The plasma may be generated using high frequency RF (HFRF) power, as well as low frequency RF (LFRF) power (e.g., dual frequency RF), constant RF, pulsed RF, or any other known or yet to be discovered plasma generation technique. The RF power supply 325 can supply a single frequency HFRF between about 5 MHz and about 300 MHz. In addition, the RF power supply 325 may also supply a single frequency LFRF between about 300 Hz to about 1,000 kHz to supply a mixed frequency (HFRF and LFRF) to enhance the decomposition of reactive species of the process gas introduced into the process chamber. The RF power may be cycled or pulsed to reduce heating of the substrate and promote greater porosity in the deposited film. Suitable HFRF power may be a power in a range of about 10 W to about 5,000 W, preferably in a range of about 200 W to about 800 W. Suitable LFRF power may be a power in a range of about 0 W to about 5,000 W, preferably in a range of about 0 W to about 200 W.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 7 Torr. The deposition rate is typically between about 2,000 Å/min. and about 20,000 Å/min.

Figure 5:
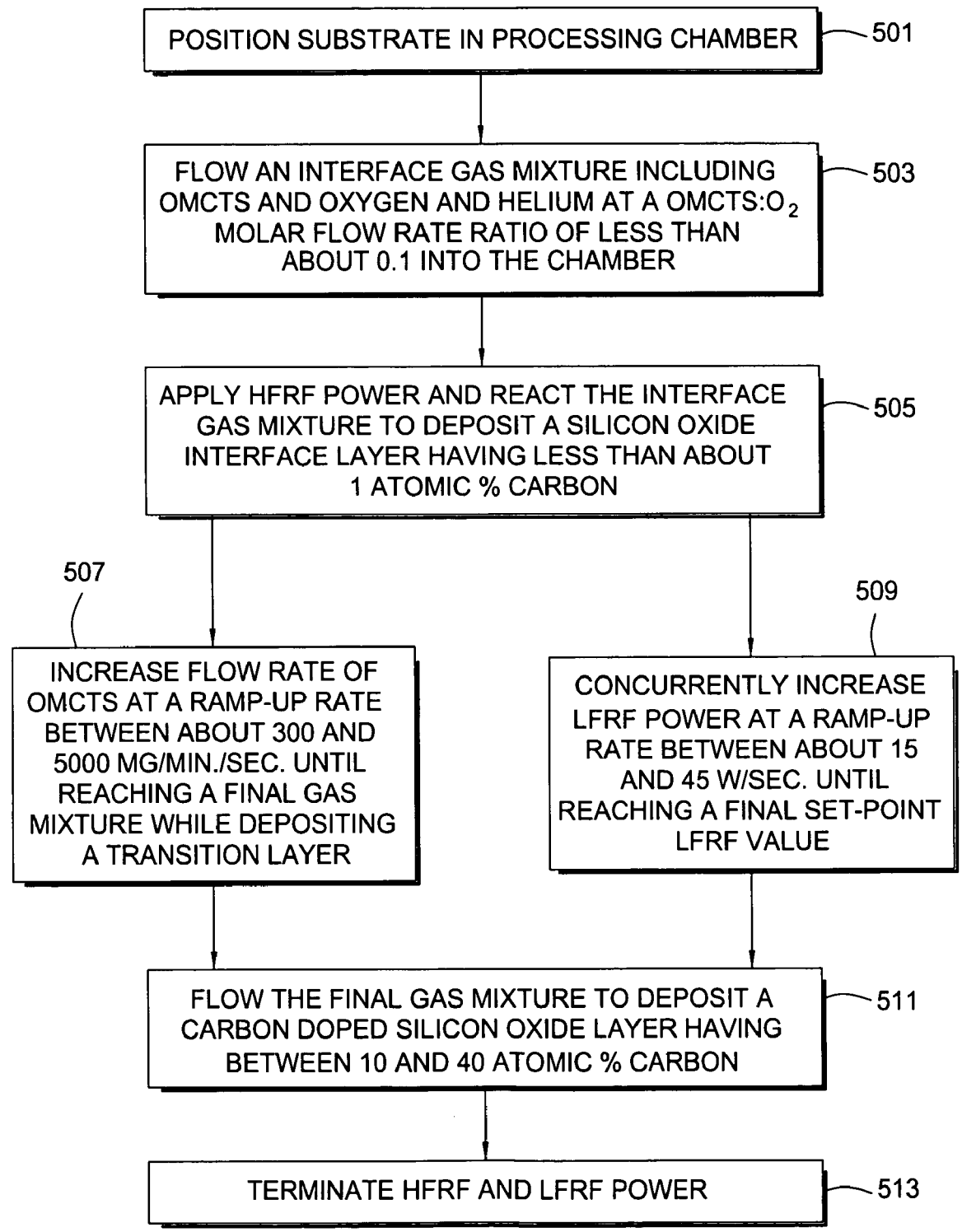
FIG. 5 is a process flow diagram illustrating a third method according to a further embodiment of the invention.

FIG. 5 is a process flow diagram illustrating a third embodiment of the invention that may be performed using a processing chamber such as the processing chamber shown in FIG. 3. In the embodiment shown in FIG. 5, an organosilicate dielectric layer is deposited according to the method described above with respect to FIG. 4 except OMCTS is used as the organosilicon compound, oxygen is used as the oxidizing gas, and helium is used as a carrier gas. The process begins in step 501, where a substrate is positioned on a substrate support in a processing chamber capable of performing PECVD. In step 503, an interface gas mixture having a molar flow rate ratio of OMCTS:$O_2$ from about 0.05 to about 0.1 is introduced with helium into the chamber through a gas distribution manifold. In step 505, HFRF power is initiated and applied to the gas distribution manifold in order to provide plasma processing conditions in the chamber. The interface gas mixture is reacted in the chamber in the presence of HFRF power to deposit an interface layer comprising a silicon oxide layer having less than 1 atomic percent carbon. The interface layer adheres strongly to the underlying substrate. In step 507, the flow rate of OMCTS is increased at a ramp-rate between about 300 mg/min./sec. and about 5000 mg/min./sec. until reaching a predetermined final set-point flow rate value of OMCTS. The flow rate of OMCTS is increased in the presence of the HFRF, while concurrently increasing a LFRF power, in step 509, from an initial set-point value of about 0 W to a final set-point value employed during the deposition of the final layer in step 511. The changing process deposition conditions (e.g., gas mixture composition, RF frequency and power) are varied so as to ensure a variation in DC bias of the gas distribution manifold of less than 60 volts so as to avoid PID. The ramp-up rate of the LFRF power is preferably in a range of about 15 W/sec. to about 45 W/sec. Upon reaching the predetermined final set-point flow rate value of OMCTS, in step 511, a final gas mixture having a composition including flowing the OMCTS at the final set-point flow rate value is reacted in the chamber, in the presence of HFRF and LFRF power, to deposit a final layer comprising a carbon doped silicon oxide layer having at least 10 atomic percent carbon. During this step, the LFRF power may be at a final set-point value in a range of about 80 W to about 200 W, preferably less than about 160 W, and more preferably about 125 W. The flow rate of carrier gas, such as helium, is preferably constant to reduce variation in DC bias, but can be varied if the variation in DC bias is less than 60 V. The HFRF and LFRF power is terminated in step 513 after depositing the organosilicate dielectric layer to a desired thickness. The chamber pressure is maintained during the HFRF and LFRF power termination.

Adhesion of the low-k organosilicate dielectric layer to the underlying substrate or barrier layer depends on the adhesion strength of the interface layer to the underlying layer. In order to achieve an interface layer that exhibits high adhesion strength, the interface layer should be oxide-rich with a very low or nonexistent presence of C—H or —$CH_3$ terminating bonds. In other words, the interface layer should contain a ratio of less than 0.001 Si—$CH_3$ or C—H bonds in comparison to Si—O bonds. Suppression of the —$CH_3$ terminating bonds depends on the composition of the gas mixture during the deposition of the interface layer. In particular, the ratio of the molar flow rate of organosilicon precursor to the molar flow rate of oxidizing gas may be varied to predetermine a sufficient ratio to deposit an interface layer having minimal —$CH_3$ terminating bonds and high adhesion energy.

Figure 6:
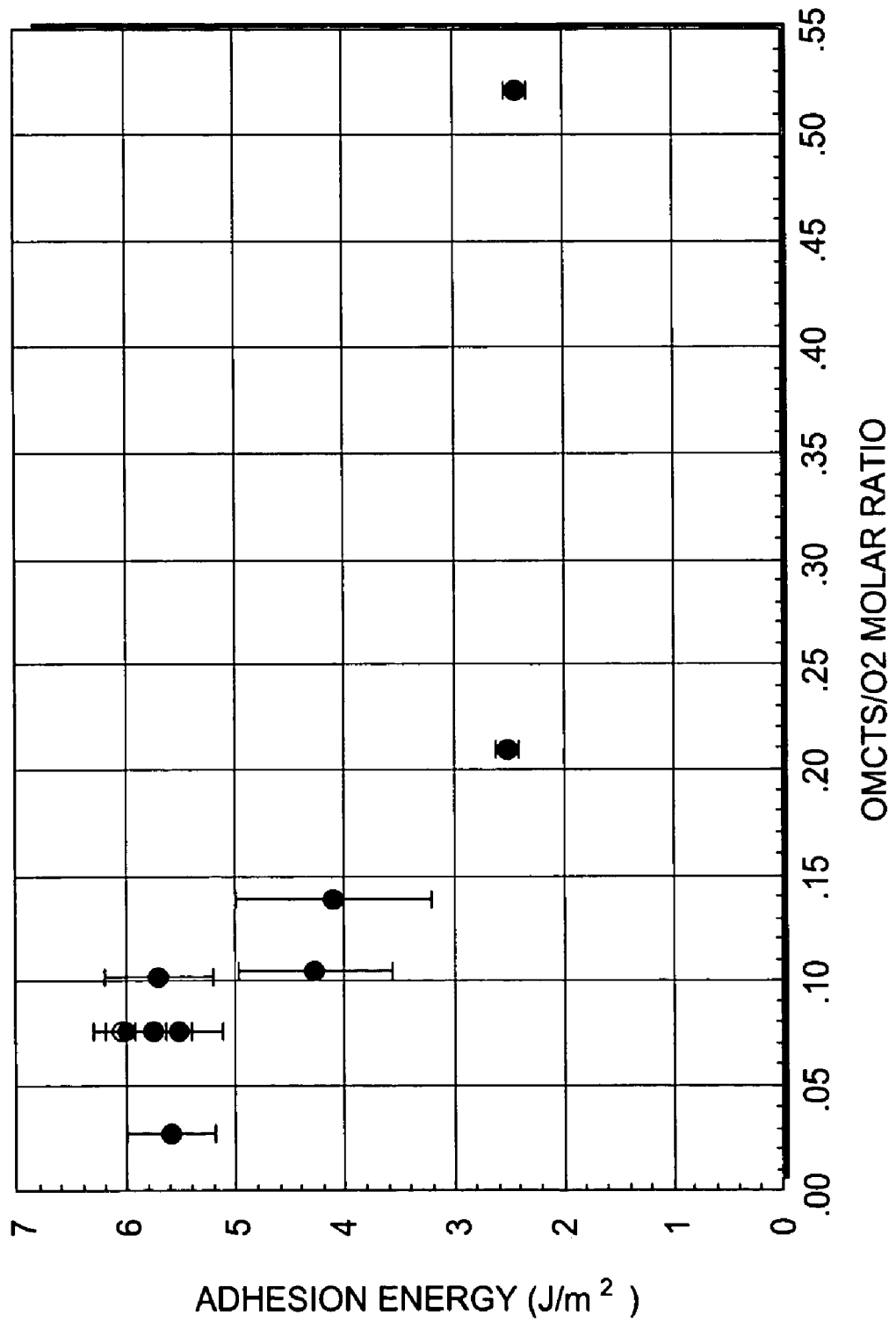
FIG. 6 shows a relationship of adhesion energy ($J/m^2$) as a function of the molar flow rate ratio of $OMCTS:O_2$.
Figure 7:
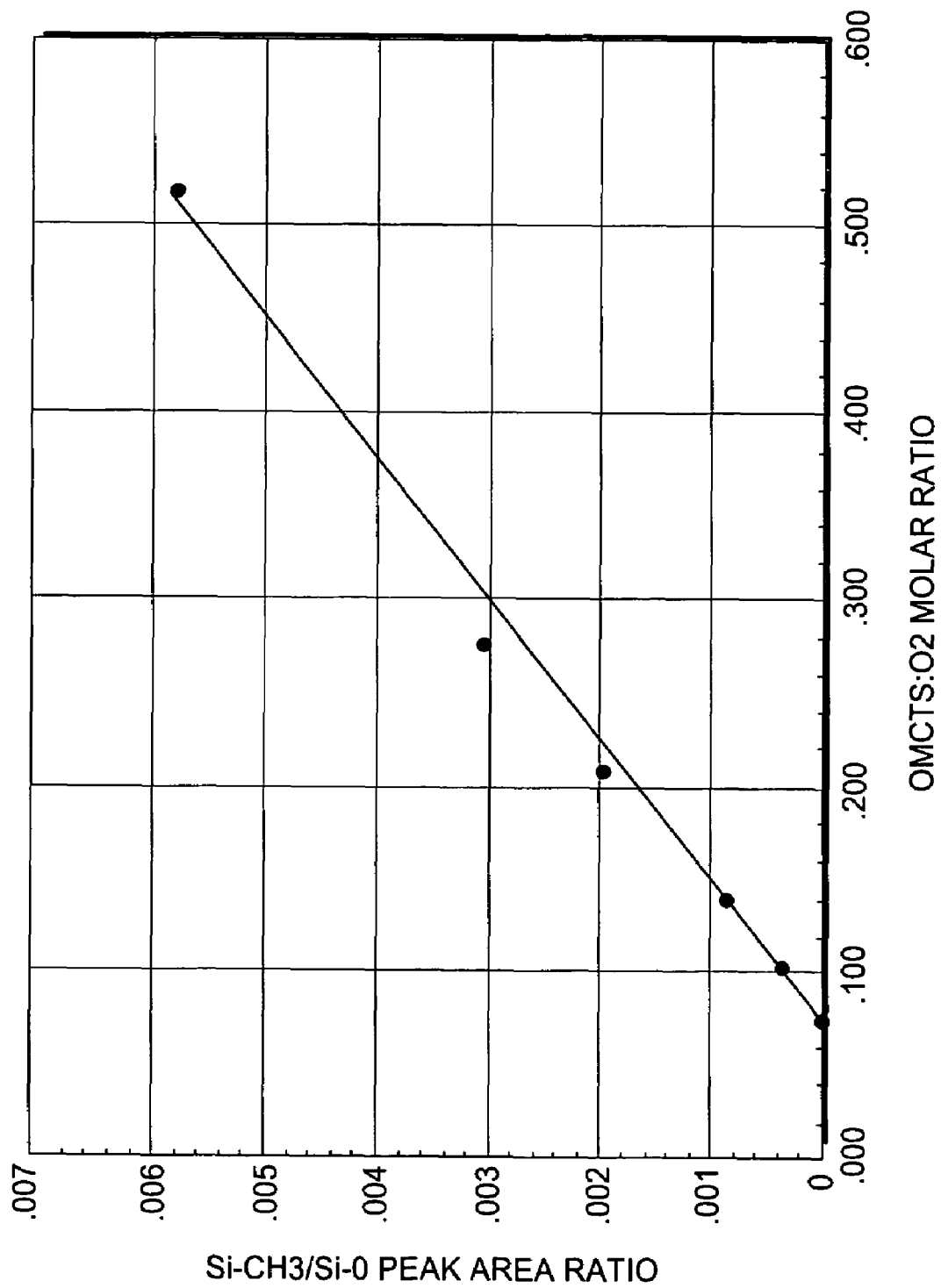
FIG. 7 shows that increasing the molar flow ratio of $OMCTS:O_2$ increases carbon content of deposited layers.

FIG. 6 shows the relationship of adhesion energy ($J/m^2$) as a function of the molar flow rate ratio of OMCTS to $O_2$. Adhesion energy was measured using a four point bend technique. Thus, to deposit a low-k organosilicate dielectric layer having good adhesion strength, the first gas mixture having a first composition including OMCTS and oxygen, the molar flow rate ratio of OMCTS to $O_2$ should be less than about 0.15, and preferably less than about 0.10, which corresponds to a flow rate ratio of OMCTS to $O_2$ less than about 2.0 OMCTS mg/minute to $O_2$ sccm, and preferably less than about 1.3 OMCTS mg/minute to $O_2$ sccm. FIG. 7 shows the relationship of Si—$CH_3$, bonds to Si—O bonds as adhesion of the molar flow ratio of OMCTS to $O_2$. Maintaining a OMCTS:O2 molar flow rate ratio of less than 0.1 provides an interface layer of the organosilicate dielectric layer having a carbon content less than 1 atomic percent carbon, as previously mentioned with respect to steps 503 and 505 of the method described in FIG. 5.

In other embodiments, in addition to varying the composition of the gas mixture and the LFRF during deposition of the organosilicate dielectric layer, a controlled ramp-up of the HFRF power from 0 W to the initiation set-point value used to deposit the interface layer (e.g. about 500 W) is preferably performed prior to deposition of the interface layer, i.e., prior to step 103 in FIG. 1. The ramp rate may be less than about 300 W/sec., preferably less than about 200 W/sec., and more preferably less than about 100 W/sec. In a further embodiment, the RF power may also be ramped-down after beginning the deposition of the initiation layer in order to reduce the deposition rate of the initiation layer, i.e., thickness of the initiation layer.

In other embodiments, the flow rates of the inert gas and the oxidizing gas are preferably stabilized at the initiation set-point values (e.g., 1000 sccm He and 700 sccm $O_2$), prior to deposition of the interface layer in order to avoid instability of process gas flow. In another embodiment, the one or more organosilicate precursor gases may be introduced into the chamber at a flow rate of about 100 mg/min. to about 200 mg/min. in order to prime the liquid delivery line as well as to avoid instability of flow. During deposition, the organosilicate precursor gas flow may be increased at a ramp-up rate in a range of about 200 mg/min./sec. to about 5000 mg/min./sec., and preferably in a range of about 300 mg/min./sec. to about 600 mg/min./sec., until reaching a final set-point value for subsequent deposition of the final layer of the organosilicate dielectric layer, in order to further avoid instability of flow and potential PID damage to the substrate.

Introducing the process gases gradually into the chamber and changing their values in a controlled manner with specific ramp-up or ramp-down rates and optionally varying the RF power, as described above, not only provides a dielectric layer with enhanced adhesion strength to the underlying substrate, but also improves the stability and uniformity of the plasma for minimizing potential PID damage to the substrate.

Following deposition of the film, the organosilicate dielectric layer may be post-treated, e.g., cured with heat, an electron beam (e-beam), or UV exposure. Post-treating the layer supplies energy to the film network to volatize and remove at least a portion of the organic groups, such as organic cyclic groups in the film network, leaving behind a more porous film network having a low dielectric constant.

EXAMPLE

Organosilicate dielectric layers were deposited on a substrate in accordance with the embodiment described above with respect to FIG. 5. The films were deposited using a PECVD chamber (i.e., CVD chamber) on a PRODUCER system, available from Applied Materials, Inc. of Santa Clara, Calif. During deposition the chamber pressure was maintained at a pressure of about 4.5 Torr and the substrate was maintained at a temperature of about 350° C.

The substrate was positioned on a substrate support disposed within a process chamber. The process gas mixture having an initial gas composition of 1000 sccm helium and 700 sccm oxygen for the interface layer was introduced into the chamber and flow rates stabilized before initiation of the HFRF power. Subsequently, HFRF power of about 500 W was applied to the showerhead to form a plasma of the interface process gas mixture composition including a OMCTS flow rate of about 700 mg/min., and deposit a silicon oxide layer having a carbon content less than about 1 atomic percent. After initiation of the HFRF power for about 2 seconds, the flow rate of OMCTS was increased at a ramp-up rate of about 600 mg/min./sec. and concurrently LFRF power was increased at a ramp-up rate of about 30 W/sec. In addition, the flow of $O_2$ was decreased at a ramp-down rate of about 5,000 sccm/sec.

As the processing parameters are varied, a transition layer comprising increasing concentrations of carbon is deposited on the interface layer. Upon reaching the final set point values, HFRF power of about 500 W and LFRF power of about 125 W was applied to the gas distribution manifold to form a plasma of the final gas mixture composition including an OMCTS flow rate of about 2,700 mg/min. to begin depositing a carbon doped silicon oxide layer on the transition layer, the carbon doped silicon oxide layer having a carbon content in a range of about 20 atomic percent excluding hydrogen. The final gas mixture composition also includes 900 sccm helium and 160 sccm oxygen. The final HFRF power is 500 W and the final LFRF power is 125 W.

Upon reaching the desired thickness of the organosilicate dielectric layer, the RF power (HFRF and LFRF) is terminated to stop further deposition. After RF power termination, the chamber throttle valve is opened to allow the process gas mixture to be pumped out of the chamber.

Many variations of the above example may be practiced. For example, other organosilane precursors, oxidizing gases, and inert gases may be used. In addition, different flow rates and/or ramp rates may be employed. In one example TMCTS may be used as the organosilane precursor instead of OMCTS and the transition layer can be deposited while increasing the TMCTS flow at a rate of 150 sccm/min. In another example, the organosilane precursor may include a flow of trimethylsilane combined with a flow of OMCTS. In another example, the interface layer may be deposited using both HFRF and LFRF (i.e., with a non-zero LFRF value). The time for depositing the dielectric layer may be varied from 0.5 to 5 seconds.

Figure 8:
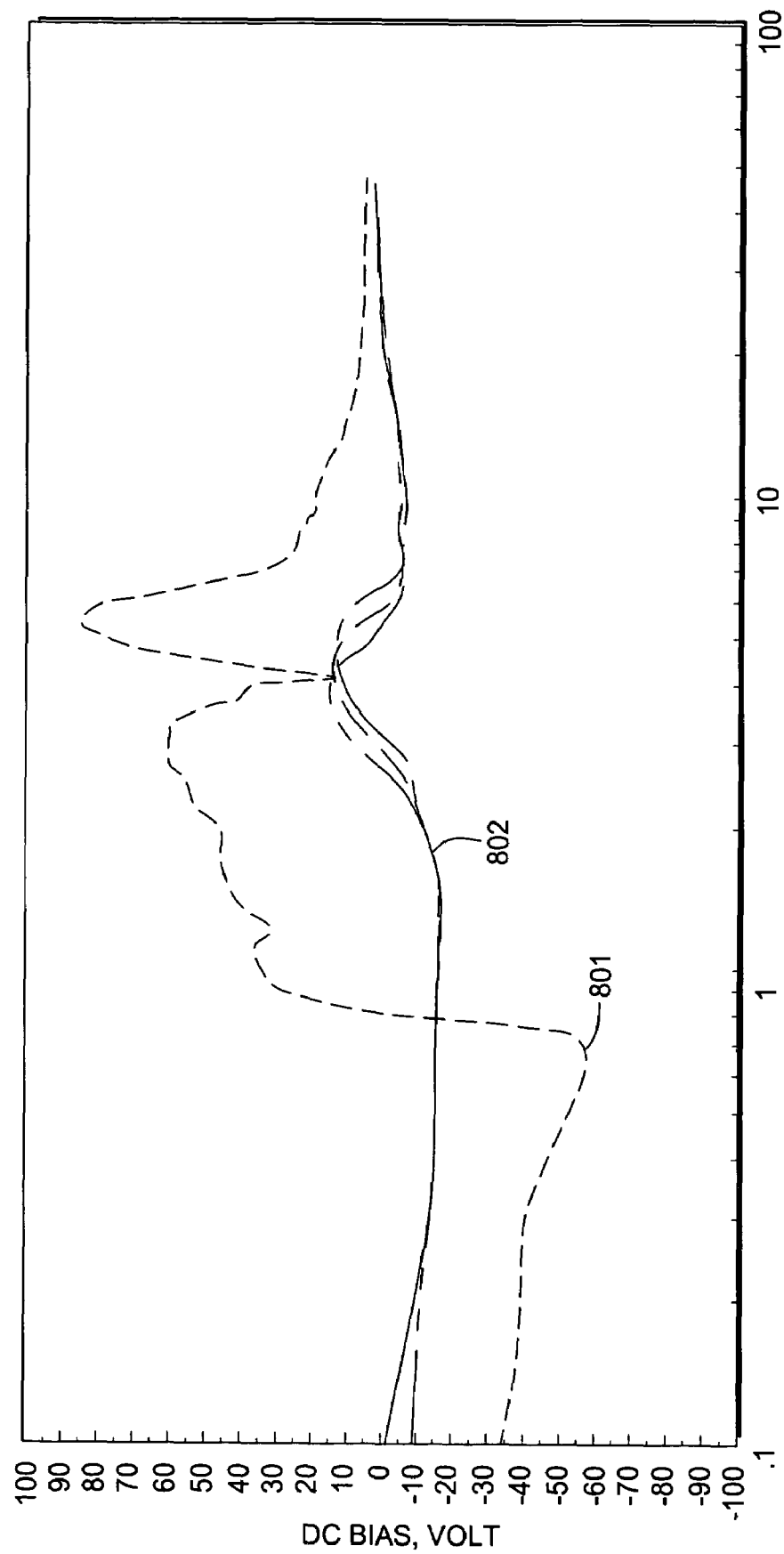
FIG. 8 is a DC bias trace obtained during an embodiment of the invention showing a variation in DC bias less than 30 volts.

FIG. 8 shows several DC bias traces 802 of the showerhead for the process of the Example in comparison to a DC bias trace 801 of the showerhead for the same process run without gradual changes in process parameters. FIG. 8 shows a surprising and significant reduction in variation in DC bias of the showerhead of less than 30 volts for the process of the invention in comparison to a variation of DC bias of 145 volts when process conditions are changed abruptly.

While not being bound by theory, it is believed that reducing the variation in DC bias of the gas distribution manifold to less than 60 volts, as described above, results in a more stable plasma and significantly and substantially reduces substrate damage.

While the foregoing is directed to embodiments of the present invention, other and further embodiments of the invention may be devised without departing from the basic scope thereof, and the scope thereof is determined by the claims that follow.

What is claimed is:

1. A method of depositing an organosilicate dielectric layer, comprising:
    positioning a substrate within a processing chamber having a powered electrode;
    flowing an interface gas mixture from a gas manifold into the processing chamber, the interface gas mixture comprising one or more organosilicon compounds and one or more oxidizing gases;
    depositing a silicon oxide layer on the substrate by applying a high frequency radio frequency (HFRF) power to the powered electrode, the silicon oxide layer having a carbon concentration less than 3 atomic percent, wherein a distance between the substrate and the gas manifold is varied while applying HFRF power;
    ramping-up the flow rate of the one or more organosilicon compounds until reaching a final gas mixture while depositing a transition layer on the silicon oxide layer, wherein a DC bias of the powered electrode varies less than 60 volts;
    flowing the final gas mixture to deposit a carbon doped silicon oxide layer on the transition layer, the carbon doped silicon oxide layer having a carbon concentration of at least 10 atomic percent; and
    terminating the HFRF power.

2. The method of claim 1, wherein the ramping-up the flow rate of the one or more organosilicon compounds comprises gradually increasing the flow rate of the one or more organosilicon compounds at a ramp-up rate in a range of about 300 mg/min./sec. to about 900 mg/min./sec.

3. The method of claim 1, wherein the silicon oxide layer comprises a carbon concentration less than 1 atomic percent.

4. The method of claim 1, wherein the carbon doped silicon oxide layer comprises a carbon concentration greater than 20 atomic percent.

5. The method of claim 1, further comprising applying a low frequency radio frequency (LFRF) power to the gas distribution manifold while depositing the carbon doped silicon oxide.

6. The method of claim 5, further comprising ramping-up the LFRF power at a ramp-up rate in a range of about 15 W/sec to about 45 W/sec while depositing the transition layer.

7. The method of claim 1, wherein the one or more organosilicon compounds comprises OMCTS.

8. The method of claim 1, wherein the one or more oxidizing gases is oxygen and wherein the interface gas mixture comprises OMCTS and oxygen at a OMCTS:$O_2$ molar flow rate ratio of less than about 0.1.

9. The method of claim 1, wherein the silicon oxide layer has a ratio of less than 0.001 Si—$CH_3$ or C—H bonds in comparison to Si—O bonds.

10. The method of claim 1, wherein the silicon oxide layer is deposited with a final LFRF of about 80 to about 125 W.

11. A method of depositing a organosilicate dielectric layer, comprising:
    positioning a substrate within a processing chamber having a gas distribution manifold;
    flowing an interface gas mixture composition from a gas manifold into the processing chamber comprising helium, OMCTS, and one or more oxidizing gases;
    depositing a silicon oxide layer on the substrate by applying a high frequency radio frequency (HFRF) power to the gas distribution manifold, the silicon oxide layer having a carbon concentration less than 3 atomic percent, wherein a distance between the substrate and the gas manifold is varied while applying HFRF power;
    increasing the flow rate of the OMCTS at a ramp-up rate in a range of about 300 mg/min/sec to about 900 mg/min/sec until reaching a final gas mixture while depositing a transition layer on the interface layer;
    flowing the final gas mixture to deposit a carbon doped silicon oxide layer on the transition layer, the carbon doped silicon oxide layer having a carbon concentration of at least 10 atomic percent; and
    terminating the HFRF power.

12. The method of claim 11, wherein DC bias of the gas distribution manifold varies less than 30 volts.

13. The method of claim 11, wherein the ramping-up the flow rate of the one or more organosilicon compounds comprises increasing the flow rate of the OMCTS at a ramp rate of 600 mg/min/sec.

14. The method of claim 11, wherein the silicon oxide layer comprises a carbon concentration less than 1 atomic percent.

15. The method of claim 11, wherein the carbon doped silicon oxide layer comprises a carbon concentration greater than 20 atomic percent.

16. The method of claim 11, further comprising applying a low frequency radio frequency (LFRF) power to the gas distribution manifold while depositing the carbon doped silicon oxide.

17. The method of claim 16, further comprising ramping-up the LFRF power at a ramp-up rate in a range of about 15 W/sec to about 45 W/sec while depositing the transition layer.

* * * * *